US011330707B2

(12) United States Patent
Britting et al.

(10) Patent No.: US 11,330,707 B2
(45) Date of Patent: May 10, 2022

(54) CARRIER SUBSTRATE FOR ELECTRICAL, MORE PARTICULARLY ELECTRONIC, COMPONENTS, AND METHOD FOR PRODUCING A CARRIER SUBSTRATE

(71) Applicant: Rogers Germany GmbH, Eschenbach (DE)

(72) Inventors: Stefan Britting, Schnaittach (DE); Xinhe Tang, Eschenbach (DE); Andreas Meyer, Speichersdorf (DE); Andrea Adler, Munich (DE)

(73) Assignee: ROGERS GERMANY GMBH, Eschenbach (DE)

( * ) Notice: Subject to any disclaimer, the term of this patent is extended or adjusted under 35 U.S.C. 154(b) by 0 days.

(21) Appl. No.: 17/279,301

(22) PCT Filed: Sep. 24, 2019

(86) PCT No.: PCT/EP2019/075619
§ 371 (c)(1),
(2) Date: Mar. 24, 2021

(87) PCT Pub. No.: WO2020/064677
PCT Pub. Date: Apr. 2, 2020

(65) Prior Publication Data
US 2021/0410282 A1    Dec. 30, 2021

(30) Foreign Application Priority Data

Sep. 26, 2018   (DE) .......................... 102018123681.6

(51) Int. Cl.
*H05K 1/02* (2006.01)
*H05K 3/00* (2006.01)

(52) U.S. Cl.
CPC ......... *H05K 1/0284* (2013.01); *H05K 3/0017* (2013.01); *H05K 2201/09154* (2013.01)

(58) Field of Classification Search
CPC .. H05K 1/0284; H05K 1/0296; H05K 1/0298; H05K 3/0017
See application file for complete search history.

(56) References Cited

U.S. PATENT DOCUMENTS

2009/0127691 A1    5/2009   Lee

FOREIGN PATENT DOCUMENTS

| CN | 107546132 A | 1/2018 |
|----|-------------|--------|
| DE | 4004844 C1  | 1/1991 |

(Continued)

OTHER PUBLICATIONS

International Preliminary Report on Patentability for International Application No. PCT/EP2019/075619, International Filing Date Sep. 24, 2019; dated Apr. 1, 2021, 8 pages.

*Primary Examiner* — Jeremy C Norris
(74) *Attorney, Agent, or Firm* — Cantor Colburn LLP

(57) ABSTRACT

A carrier substrate (1) that includes an insulation layer (11) and a metal layer (12), wherein a flank profile (2), in particular an etching flank profile, at least zonally borders the metal layer (12) in a primary direction (P) extending parallel to the main extension plane (HSE), wherein, viewed in the primary direction (P), the flank profile (2) extends from a first edge (15) on an upper side (31) of the metal layer (12), which faces away from the insulation layer (11), to a second edge (16) on a lower side (32) of the metal layer (12), which faces the insulation layer (11), characterized in that the flank profile (2), viewed in the primary direction (P), has at least one local maximum (21) and at least one local minimum (22).

18 Claims, 6 Drawing Sheets

(56) References Cited

FOREIGN PATENT DOCUMENTS

| | | |
|---|---|---|
| DE | 19927046 B4 | 1/2007 |
| DE | 102009033029 A1 | 1/2011 |
| DE | 102013104739 A1 | 9/2014 |
| DE | 102015107223 A1 | 11/2016 |
| EP | 1061783 A2 | 12/2000 |
| EP | 3080055 B1 | 11/2018 |
| EP | 3474643 A1 | 4/2019 |
| JP | H1093211 A | 4/1998 |
| JP | H11322455 A | 11/1999 |
| WO | 2017222235 A1 | 12/2017 |

CARRIER SUBSTRATE FOR ELECTRICAL, MORE PARTICULARLY ELECTRONIC, COMPONENTS, AND METHOD FOR PRODUCING A CARRIER SUBSTRATE

CROSS-REFERENCE TO RELATED APPLICATIONS

This application is a National Stage filing of PCT/EP2019/075619, filed Sep. 24, 2019, which claims priority to DE 10 2018 123 681.6, filed Sep. 26, 2018, both of which are incorporated by reference in their entirety herein.

BACKGROUND

The present invention deals with a carrier substrate for electrical, in particular electronic, components and a method of manufacturing a carrier substrate.

Carrier substrates are well known from the prior art, for example as printed circuit boards or circuit boards, for example from DE 10 2013 104 739 A1, DE 19 927 046 B4 and DE 10 2009 033 029 A1. Typically, connection areas for electrical components and conductor tracks are arranged on one component side of the carrier substrate, wherein the electrical components and the conductor tracks can be interconnected to form electrical circuits. Essential components of the carrier substrates are an insulation layer, which is preferably made of a ceramic, and a metal layer bonded to the insulation layer. Because of their comparatively high insulation strengths, insulation layers made of ceramics have proven to be particularly advantageous. The metal layer can then be structured to provide conductor tracks and/or connection areas for the electrical components.

In addition to low thermal resistance, a high thermal shock resistance is also desirable, which contributes to a longevity of the corresponding carrier substrate. It has proved advantageous, for example, to realize recesses in the edge area of the metal layer in order to relieve mechanical stresses and improve the breakage behaviour of master cards. In particular, the improvement of the fracture behaviour of master cards is disclosed in EP 1 061 783 A2. However, this generally leads to a reduction in an effective functional area for the connection of electrical or electronic components.

SUMMARY

Based on this background, the present invention makes it its task to improve the carrier substrates known from the prior art, in particular with regard to their thermal shock resistance, an effective size of the functional area and/or a breakage behaviour of master cards.

This task is solved by a carrier substrate as described herein and a method as described herein. Further advantages and features of the invention result from the independent claims and the dependent claims as well as the description and the attached figures.

According to the invention, a carrier substrate, in particular a metal-ceramic substrate, is provided, which comprises an insulating layer, preferably a ceramic layer, and a metal layer, a flank profile, in particular an etching flank profile, at least zonally bordering the metal layer at the outermost circumference in a primary direction running parallel to the main extension plane, wherein, viewed in the primary direction, the flank profile extends from a first edge on an upper side of the metal layer facing away from the insulation layer to a second edge on a lower side of the metal layer facing the insulation layer, and wherein the flank profile, viewed in the primary direction, has at least one local maximum and at least one local minimum, in particular relative to the surface of the insulation layer facing the metal layer.

BRIEF DESCRIPTION OF THE FIGURES

Further advantages and features result from the following description of embodiments with reference to the attached figures. Individual features of the individual embodiment can thereby be combined with each other within the scope of the invention, which show.

DETAILED DESCRIPTION

Figure 1:
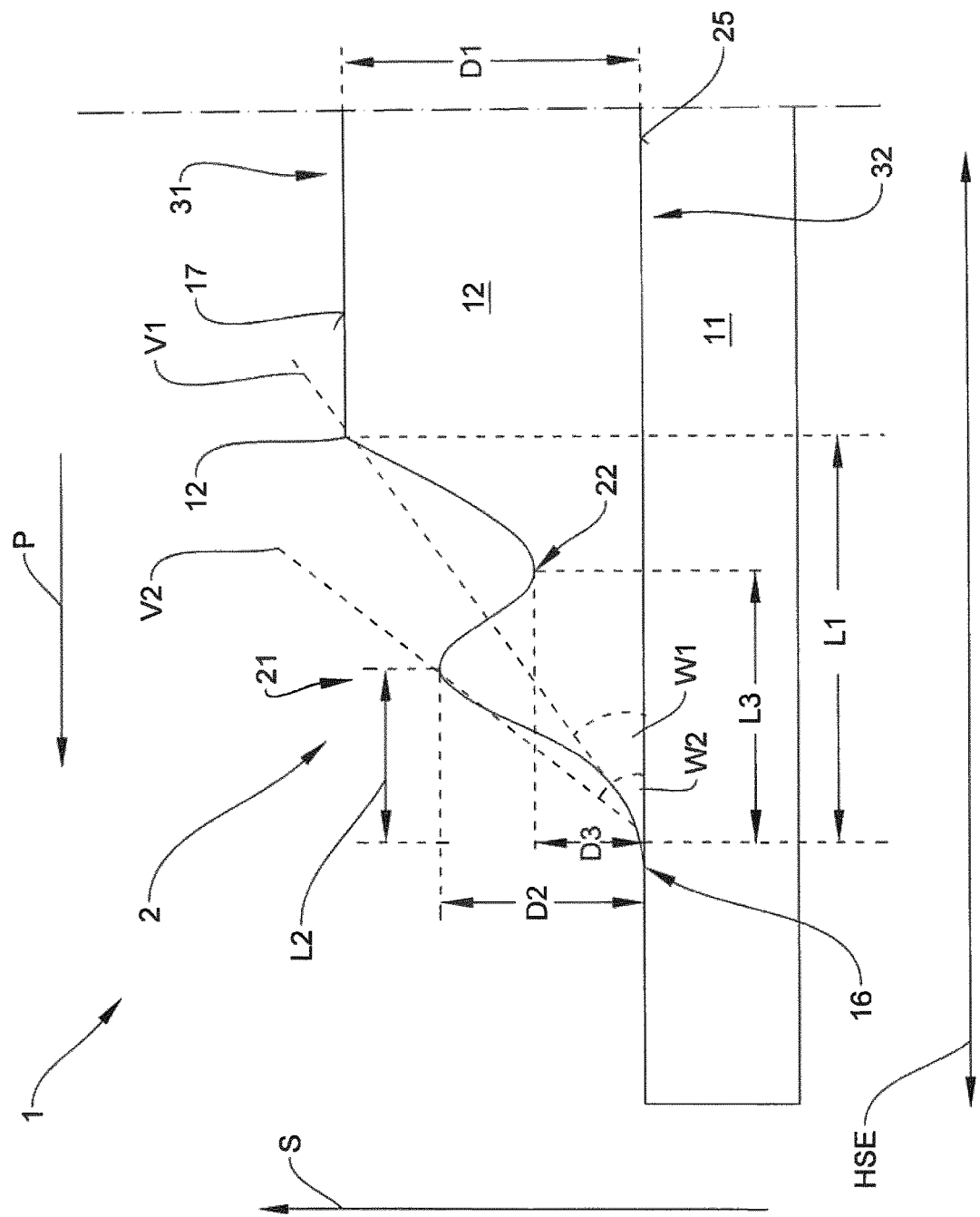
FIG. 1: Schematic representation of a carrier substrate according to a first preferred embodiment of the present invention, FIG. 2 Schematic representation of a carrier substrate according to a second preferred embodiment of the present invention FIG. 3 Schematic representation of a carrier substrate according to a third preferred embodiment of the present invention, and FIG. 4 Schematic representation of a carrier substrate according to a fourth preferred embodiment of the present invention.

Compared to the prior art, the carrier substrate according to the invention has a flank profile with at least one local maximum and at least one local minimum, i.e., a local maximum and a local minimum are arranged between the first edge and the second edge. In the sense of the invention, the terms "maximum" or "minimum" mean the height or thickness of the metal layer at this location, relative to the surface of the insulation layer facing the metal layer. In other words, a protrusion or bulge, for example in the form of a pre-hump or pre-elevation, is formed in the flank profile. It turned out in an advantageous manner that a thermal shock resistance can be significantly improved with a flank profile, which has at least one local maximum and one local minimum. In particular, the primary direction extends outward, i.e., from a region provided as a functional area by the metal layer to a metal-free region on the carrier substrate. The improvement in thermal shock resistance due to the flank profile with the local maximum and the local minimum also advantageously allows material weakening, for example in the form of dome-shaped cavities, to be dispensed with in the edge region, which means that the effective functional area on the upper side of the metal layer can be increased. In this case, the flank profile is formed as the outer side of the metal layer in a cross-section perpendicular to the main extension plane and parallel to the primary direction or a corresponding sectional view. Preferably, the number of local maxima and local minima is less than 5 in each case. More preferably, there is exactly one local maximum and one local minimum. The flank profile is preferably wave-shaped.

Preferably, a turning point or a reversal point is formed between the first edge and the second edge. Preferably, the local maximum is arranged between the inflection point and the second edge and the local minimum between the first edge and the turning point or the reversal point. For example, the flank profile can be classified, at least in some areas, by a polynomial of at least third degree. It is conceivable that the flank profile along a circumference of the metal layer, i.e., along a closed curve within the main extension plane at the outermost circumference of the metal layer, is configured to more than 50%, preferably to more than 75% and more preferably completely with a local maximum and a local minimum. By local maximum/minimum the skilled person understands in particular a region in which in the surrounding area the flank profile is not greater/not smaller than in the local maximum/minimum. The flank profile in the form of global maxima or minima may well have larger or smaller values than the local maximum or minimum. For example, the flank profile has a global maximum at the first edge, while a global minimum is formed at the second edge. Furthermore, it is preferably provided that the lank profile extends continuously, i.e., essentially steplessly, along the primary direction.

Preferably, the insulation layer has $Al_2O_3$, $Si_3N_4$, AlN, ZTA (zirconia toughened alumina), MgO, BeO, SiC or high-density MgO (>90% of the theoretical density), TSZ (tetragonally stabilized zirconia) or ZTA as material for the ceramic. In this context, it is also conceivable that the insulation layer is configured as a composite or hybrid ceramic in which, in order to combine various desired properties, several insulation layers, each of which differs in terms of its material composition, are arranged on top of one another and joined together to form an insulation layer. It is even conceivable that the insulation layer is made of an organic material, such as a resin, for example, to form an IMB. Conceivable materials for the metal layer include copper, aluminum, molybdenum and/or alloys thereof, and laminates, such as CuW, CuMo, CuAl, AlCu and/or CuCu, in particular a copper sandwich structure with a first copper layer and a second copper layer, wherein a grain size in the first copper layer is different from the second copper layer.

Preferably, the flank profile is manufactured by an etching step. Alternatively or additionally, it is conceivable that the flank profile is produced by milling and/or laser ablation. Furthermore, it is preferably provided that the carrier substrate has at least one further metal layer and/or one further insulation layer in addition to the metal layer and the insulation layer. In this case, the carrier substrate is preferably assembled in a sandwich construction and the insulation layer is arranged between the metal layer and the further metal layer. Preferably, it is provided that the further metal layer is free of structuring. In other words, the further metal layer is formed without interruptions on the side of the ceramic layer opposite the metal layer. In this case, the further metal layer forms a backside metallization, which allows, for example, the use of a comparatively thin insulation layer of less than 800 μm.

Furthermore, it is conceivable that the second edge, viewed along a circumferential direction (i.e., along a direction following the general course of the first edge and the second edge around the functional area), borders the connection surface in the main extension plane and has a meandering, stamp-edge-shaped and/or saw-tooth-shaped course in the circumferential direction, the meandering, stamp-edge-shaped and/or saw-tooth-shaped course extending in particular over the entire second edge of the metal layer. It is also conceivable that the meander-shaped, stamp-edge-shaped and/or saw-tooth-shaped course of the metal layer extends only over a partial region of the second edge of the metal layer, or that a plurality of partial regions are spaced from each other by a distance, along the circumferential direction. By forming a structured and/or modulated course of the second edge, its surface enlargement is configured in such a way that, essentially independent of the location of the occurrence of a mechanical stress, the latter can be advantageously distributed. Preferably, the first edge is similarly modulated. However, the flank profile in the direction of rotation can also have irregular recesses, i.e., for example, small and larger recesses which are mixed or alternate with one another, or which are wave-line-shaped, rectangular, parallelogram-shaped, or jagged.

In particular, it is provided that the bonding area does not extend along the entire length of the insulation layer along the primary direction. In other words, the insulation layer protrudes in the direction of the primary extension plane with respect to the metal layer, in particular with respect to the second edge. Preferably, the metal layer is structured and the first and second edges are formed as a result of a structuring operation, for example an etching or a surface milling of insulation trenches. Furthermore, it is conceivable that the metal layer has a material weakening in an edge region, which extends at the first edge in the direction of a centre of the metal layer or in the direction of the functional area, i.e., inwardly. Viewed in the primary direction, the edge region thus lies opposite the flank profile with respect to the first edge. A material weakening means in particular a variation or modulation in the metal layer thickness. For example, a material weakening means a dome-shaped recess on the upper side of the metal layer. Preferably, a ratio of an extension of the edge region to a total length of the metal layer dimensioned in the same direction has a value of less than 0.25, preferably less than 0.15, and more preferably less than 0.1. Furthermore, it is conceivable that, viewed in the primary direction, a further edge region opposite the edge region is formed by the metal layer (the said ratio then takes into account the extension of the edge region and the further edge region). Preferably, it is provided that the dimensioning of the edge region, i.e., in particular the ratio of the extension of the edge region as seen in the primary direction to the total length of the metal layer measured in the same direction, depends on the first thickness of the metal layer. For example, for metal layers whose first thickness is greater than 150 μm—for example between 0.4 and 2.5 mm—the ratio of the extension of the edge region, viewed in primary direction, to the total length of the metal layer measured in the same direction is less than 0.35, preferably less than 0.25 and more preferably less than 0.18. In this case, the extension or the total length is measured in particular in a direction oriented perpendicular to the course of the first edge. In particular, the measurement of the extension begins with the first edge and is directed towards a central region of the metal layer.

Furthermore, it is preferably provided that the second edge is circumferentially covered, in particular at least partially or completely, with a filler material. In this case, the filler material is suitable for suppressing crack formation at the edge, i.e., inhibiting or even completely preventing expansion of the crack. Preferably, the filler material comprises a plastic material, such as polyimide, polyamide, epoxy or polyetheretherketone. In this context, it is also conceivable that a ceramic component is added to the plastic material. Examples of such an additive are silicon nitride, aluminum nitride, aluminum oxide, boron nitride or glass.

It is also conceivable that carbon fibers, glass fibers and/or nanofibers are added to the plastic material. Preferably, it is provided that the filler material is heat resistant, i.e., the filler material does not melt at temperatures occurring during the manufacture of the carrier substrate after application of the filler material and/or during soldering. Furthermore, it is preferably provided that the filler material is suitable to form a strong and good bond with the insulation layer, preferably the selected ceramic material, and the metal layer, preferably the selected metal, such as copper. It is further provided that the coefficient of thermal expansion of the filler material is equal to or greater than the coefficient of thermal expansion of the insulation layer and/or the metal layer. For example, the coefficient of thermal expansion of the filler material is more than three times greater than the coefficient of thermal expansion of the metal layer.

According to a preferred embodiment of the present invention, it is provided that the metal layer has a first thickness outside the flank profile, in particular in a central region provided as a functional area, and a second thickness in the local maximum, the second thickness being smaller than the first thickness. This ensures that the local maximum does not protrude with respect to the upper side of the metal layer. In this case, the local maximum extends in a bead-like manner in the circumferential direction and forms a protrusion concerning the height with respect to the global maximum of the flank profile, namely the first edge. It is conceivable here that the local maximum is part of a plateau or a dome-shaped bulge. Viewed in the circumferential direction (i.e., when following an extension direction of the first edge or the second edge), the local maximum thereby extends over more than 50% of the entire circumference of the metal layer, preferably over more than 75% of the metal layer, and more preferably completely along the circumference of the metal layer. It is further provided that the metal layer at the first edge has the first thickness and in particular represents the first thickness of a maximum thickness of the metal layer.

Advantageously, it is provided that a ratio of the second thickness to the first thickness has a value, which is smaller than 0.95, preferably smaller than 0.9, and more preferably smaller than 0.8. It turned out in an advantageous manner that the relative ratio of the second thickness to the first thickness can be chosen in a near independent manner in order to achieve the positive effect on the thermal shock resistance if the ratio is at least smaller than 0.9. That is, a comparatively similar flank profile can be selected for a large first thickness of the metal layer or a small first thickness of the metal layer.

Advantageously, it is provided that a ratio of the second thickness to the first thickness has a value smaller than 1.

Advantageously, it is provided that the flank profile, measured in the primary direction, extends over a first length between the first edge and the second edge, a ratio between the first length and the first thickness having a value between 0.5 and 1.9, preferably between 0.6 and 1.7, and more preferably between 0.7 and 1.5. This allows comparatively wide flank curves to be realized. By way of comparison, the ratio of the first length to the first thickness is typically less than 0.5. It turned out that this widening of the flank profile not only has a positive effect on thermal shock resistance, but also supports heat spreading, especially for components that are placed very close to the first edge, since these can then also use the area below the flank profile of the metal layer for heat transport. A wide flank profile also allows the structuring with local maximum and local minimum to be set in a more controlled manner. Preferably, the second thickness is measured at a point which, viewed in primary direction, is 2/5 times the first length away from the second edge, especially if the local maximum is not clearly evident from the flank profile.

Preferably, it is provided that the flank profile extends from the second edge at the lower side to the local maximum over a second length, wherein a ratio between the second length and the first length has a value between 0.2 and 0.7, preferably between 0.25 and 0.6 and more preferably between 0.3 and 0.5. In other words, it turned out that it is particularly advantageous if the local maximum, i.e., the local elevation in the flank profile, as seen from the second edge, is arranged in the first half or, preferably, in a region between the first half and the first third of the flank profile. In this way, the local maximum is located in particular at the outermost edge of the metal layer and thus supports the thermal shock resistance of the entire carrier substrate.

Preferably, an imaginary straight first connection line passing through the first edge and the second edge is inclined about a first angle with respect to a bonding area via which the metal layer is bonded to the insulation layer, and wherein an imaginary straight second connection line passing through the second edge and the local maximum is inclined about a second angle with respect to the bonding area, wherein a ratio of the second angle to the first angle is less than 0.8, preferably less than 0.7 and more preferably less than 0.6. This preferably applies to carrier substrates having a comparatively large first thickness, for example first thicknesses between 0.4 and 2.5 mm. In this embodiment, it is particularly intended that the local maximum is formed, in particular, in a flat flank profile section within the first third. It turned out that with such a very flat flank profile in the first third (viewed from the second edge) with a not significantly protruding local maximum, significant improvements in thermal shock resistance can already be achieved. In addition, such a profile can be covered comparatively easily with a filler material or with a potting material. For carrier substrates with a comparatively small first thickness, it is preferably provided that the second angle is larger than the first angle. For example, the ratio of the second angle to the first angle has a value between 1 and 2.5, preferably between 1.2 and 2, or more preferably of about 1.4 and 1.8. It is also conceivable that instead of the local maximum, a point is taken on the outside of the flank profile which, viewed in the primary direction, is 2/5 times the first length away from the second edge.

Preferably, the second angle is smaller than the first angle or the first angle is larger than the second angle. It turned out that such a ratio between the first angle and the second angle is particularly advantageous for carrier substrates having a comparatively large first thickness. Preferably, the first thickness in this case is greater than 300 µm, preferably greater than 400 µm and more preferably greater than 500 µm or even greater than 1 mm. For example, the first thickness has a value between 300 µm and 5 mm, preferably between 400 µm and 3 mm and more preferably between 500 µm and 1 mm.

Preferably, the ratio between the first angle and the second angle changes along a circumferential direction extending parallel to the main extension plane, in particular the ratio is modulated, for example periodically. It is conceivable that the ratio between the first angle and the second angle is also reversed, at least in sections, i.e., there are sections in which the first angle is greater than the second angle and sections in which the second angle is greater than the first angle.

In a preferred embodiment, it is provided that a ratio between the second thickness and the first length has a value between 0.08 and 0.4, preferably between 0.09 and 0.35, and more preferably between 0.1 and 0.3 or even 0.1, especially when the second angle is smaller than the first angle. Especially for the values between 0.1 and 0.3, there has been a significant improvement in thermal shock resistance, which significantly extends the lifetime of the carrier substrates.

In a further embodiment of the present invention, it is provided that the metal layer has a third thickness in the local minimum, a ratio of the third thickness to the second thickness having a value between 0.1 and 1, preferably between 0.2 and 0.9 and more preferably between 0.3 and 0.8. It turned out to be particularly advantageous if the local minimum has a significantly smaller thickness than the local maximum, according to which, for example, the casting material or filler material can penetrate into these depressions in the region of the local minimum and thus lead, for example, to an additional form fit viewed in the primary direction. In this case, the ratio of the third thickness to the second thickness, viewed in the circumferential direction, may change. In particular, the ratio between the third thickness and the second thickness could be periodically modulated in the circumferential direction.

In a particularly preferred embodiment, it is provided that the metal layer has a first thickness of between 0.2 and 1 mm, preferably between 0.25 and 0.8 mm, and more preferably between 0.3 and 0.6 mm, or between 0.4 and 2.5 mm, preferably between 0.5 and 2 mm, and more preferably between 0.6 and 1.5 mm. Advantageously, it turned out that the flank profile with the local maximum and the local minimum has a beneficial effect on the thermal shock resistance, both for the carrier substrates having usual first thickness and for a first thickness which is comparatively large. Preferably, the first thickness is greater than 1 mm, preferably greater than 1.5 mm, and more preferably greater than 2 mm. In particular, for the carrier substrate having a comparatively large first thickness, it is provided that the insulation layer, i.e., in particular the ceramic layer, has a thickness which is smaller than 1 mm, preferably smaller than 0.8 mm, and more preferably smaller than 0.6 mm. This additionally allows the thermal conductivity of the carrier substrate to be optimized.

Another aspect of the present invention concerns a master card comprising a plurality of carrier substrates separated from one another by at least one predetermined breaking line, the predetermined breaking line extending adjacent to and along the flank profile having the local maximum and the local minimum, in particular along its second edge. Along the predetermined breaking line, the individual carrier substrates are separated by breaking in the manufacturing process. Preferably, the predetermined breaking line runs along the flank profile of the further metal layer, i.e., the one opposite the metal layer with respect to the insulation layer in a stacking direction perpendicular to the main extension plane. It turned out that the flank profile having the local maximum and the local minimum has a positive effect in an advantageous manner on the breaking behaviour of the master card during separation into the individual carrier substrates. In particular, the probability of damage during separation of the carrier substrates is reduced and thus the exclusion of unusable carrier substrates is reduced. In particular, it is provided that the amount of metal per unit volume (specific amount of metal) is reduced to between 10 and 80%, preferably to between 10 and 60% and more preferably to between 10 and 40%, in the flank area compared with the central area of the metal layer having the functional area.

Preferably, the flank profile, in particular the second edge, for example of the further metal layer or of the backside metallization, has a distance from the predetermined breaking line measured in the primary direction, the distance being smaller than 1 mm, the distance preferably having a value between 0.05 and 1 mm. Preferably, a ratio of a distance measured in the primary direction between the second edge and the predetermined breaking line and the first length has a value between 0.15 and 2.0, preferably between 0.2 and 1.6 and more preferably between 0.3 and 1.2. This applies in particular to comparatively thick first thicknesses, i.e., first thicknesses between 0.4 and 2.5 mm. Preferably, it is provided that the distance between the second edge and the predetermined breaking line measured in the primary direction is smaller than the first length. It is further provided that, for separating the individual carrier substrates, two groups of predetermined breaking lines are provided which intersect and preferably run perpendicular to one another.

Preferably, the carrier substrate is embedded in an encapsulation, in particular together with a first electrical component. Combined with the curved etch edge profile, the carrier substrate particularly can be embedded particularly effectively with the encapsulation and forms an effective form fit or anchoring. This is particularly true for the etch edge courses in which the second angle is greater than the first angle. In this case, the encapsulation is preferably massive, so that no cavities are formed between the encapsulation and the carrier substrate. Thus, a particularly compact electronic module can be advantageously realized, the carrier substrate of which is advantageously impact-protected.

Furthermore, it is preferably provided that a second electrical component is provided on the outside of the encapsulation, the first electrical component preferably being connected to the first electrical component via a through-hole connection extending through the encapsulation. For example, it is provided that in the manufactured state a through-hole connection makes contact with a terminal on an upper side of the first electrical component, i.e., a side which, in the assembled state, is opposite the carrier substrate in the stacking direction. Furthermore, it is preferably provided that a further metallization, in particular structured metallization, is provided on the outside of the encapsulation, which permits easy connection of the second electrical or electronic component.

A further aspect of the invention concerns a method of manufacturing a carrier substrate according to any one of the preceding claims, wherein the flank profile is preferably produced by an etching step, in particular a single etching step. All features described for the carrier substrate and its advantages can be transferred analogously to the method and vice versa.

For this purpose, the metal layer is preferably bonded to the insulating layer by means of an AMB process and/or a DCB process.

The skilled person understands a "DCB process" (direct copper bond technology) or a "DAB process" (direct aluminum bond technology) to be such a process which is intended, for example, to bond metal layers or sheets (e.g., copper sheets or foils or aluminum sheets or foils) to one another and/or to ceramics or ceramic layers, using metal or copper sheets or metal or copper foils which have a layer or coating (fusion layer) on their surface sides. In this process, described for example in U.S. Pat. No. 3,744,120 A or in DE23 19 854 C2, this layer or coating (fusion layer) forms a eutectic with a melting temperature below the melting temperature of the metal (e.g., copper), so that by placing the foil on the ceramic and by heating all the layers, they can be bonded to one another by melting the metal or copper essentially only in the region of the fusion layer or oxide layer.

In particular, the DCB process then has, for example, the following process steps:
- Oxidizing a copper foil in such a way that a uniform copper oxide layer is formed;
- Placing the copper foil on the ceramic layer;
- Heating the composite to a process temperature between about 1025 to 1083° C., e.g., to about 1071° C., and
- Cooling to room temperature.

By an active soldering process, e.g., for bonding metal layers or metal foils, in particular also copper layers or copper foils with ceramic material, is meant a process which is specifically also intended to produce metal-ceramic substrates, a bond being produced at a temperature between approx. 650-1000° C. between a metal foil, for example copper foil, and a ceramic substrate, for example aluminum nitride ceramic, using a brazing alloy which, in addition to a main component such as copper, silver and/or gold, also contains an active metal. This active metal, which is for example at least one element of the group Hf, Ti, Zr, Nb, Ce, establishes a connection between the brazing alloy and the ceramic by chemical reaction, while the connection between the brazing alloy and the metal is a metallic brazing connection. Alternatively, a thick film process is also conceivable for bonding. Preferably, the metal layer is bonded to the insulation layer by means of a DCB process or a DAB process. Surprisingly, it has been found that a particularly large improvement in thermal shock resistance can be achieved if the metal layer is bonded to the insulation layer by means of a DCB process.

In the sense of the invention, the term essentially means deviations from the respective exact value by +/−15%, preferably by +/−10% and more preferably by +/−5% and/or deviations in the form of changes that are insignificant for the function.

Further advantages and features result from the following description of preferred embodiments of the object according to the invention with reference to the attached figures. Individual features of the individual embodiment can thereby be combined with each other within the scope of the invention. FIG. 1 shows a carrier substrate 1 according to a first preferred embodiment of the present invention. Such carrier substrates 1 preferably are used as carriers of electronic or electrical components which can be connected to the carrier substrate 1. Essential components of such a carrier substrate 1 are an insulation layer 11 extending along a main extension plane HSE and a metal layer 12 bonded to the insulation layer 11. The insulation layer 11 is made of at least one material comprising a ceramic. The metal layer 12 and the insulation layer 11 are arranged one above the other along a stacking direction S extending perpendicularly to the main extension plane HSE and are materially bonded to one another via a bonding area 25. In the finished state, the metal layer 12 is structured to form conductor tracks or connection points for the electrical components. For example, this structuring is etched into the metal layer 12. In advance, however, a permanent bond, in particular a material bond, must be formed between the metal layer 12 and the insulation layer 11.

In order to permanently bond the metal layer 12 to the insulation layer 11, a system for manufacturing the carrier substrate, in particular in an SFB (Super-Flat-Bonding) bonding process, comprises, for example, a furnace in which a provided pre-arrangement of metal and ceramic is heated and thus the bond is achieved. For example, the metal layer 12 is a metal layer 12 made of copper, and the metal layer 12 and the insulation layer 11 are bonded to each other using a DCB (Direct-Copper-Bonding) bonding process. Alternatively, the metal layer 12 can be bonded to the ceramic layer 11 using an active soldering process.

In particular, the metal layer 12 has an upper side 31 facing away from the ceramic layer 11 and a lower side 32 facing the ceramic layer 11. The upper side 31 of the metal layer 12 comprises a functional area 17 on which, in particular, electrical or electronic components can be mounted. The upper side 31 is bordered in a direction parallel to the main extension plane HSE by a first edge 15, while the lower side 32 of the metal layer 12 is materially bonded to the ceramic layer 11 via the bonding area 25. The bonding area 25 is bordered outwardly in a direction extending parallel to the main extension plane HSE by a second edge 16. In this case, the first edge 15 and the second edge 16 do not lie congruently one above the other, as seen in a stacking direction S extending perpendicular to the main extension plane HSE, but are offset with respect to one another along a primary direction P. The primary direction P runs in particular from a central region of the metal layer 12, in which, for example, the functional area 17 is provided, outwardly to a region of the carrier substrate 1 which is metal-free, i.e., a region in which essentially the ceramic layer forms the outer side of the carrier substrate. The first edge 15 is connected to the second edge 16 by a flank profile 2 extending along the primary direction P. For example, the flank profile 2 is produced by an etching process, in particular by a single etching step. The flank profile 2 forms the outer side of the metal layer 12 in the region between the first edge 15 and the second edge 16, in particular as viewed in a cross-section extending perpendicular to the main extension plane HSE.

To improve the thermal shock resistance, it is particularly intended that the flank profile 2 has at least one local maximum 21 and at least one local minimum 22 between the first edge 15 and the second edge 16. The local minimum 22, viewed in the primary direction P, is preferably located between the first edge 15 and the local maximum 21.

In particular, it is provided that the metal layer 12 has a first thickness D1 in the central region, that is, in particular, in the region of the functional area 17, and a second thickness D2 in the local maximum 21, the first thickness D1 being greater than the second thickness D2. Preferably, a ratio of the second thickness D2 to the first thickness D1 has a value between 0.5 and 0.9, preferably between 0.6 and 0.9, and more preferably between 0.7 and 0.9. In other words, the flank profile 2 has an additional bulge or elevation, for example in the form of a hill-like or bead-like elevation, between the first edge 15 and the second edge 16 of the metal layer 12, the local maximum 21 being smaller than a global maximum defined, for example, by the first thickness D1 of the metal layer 12. It is further provided that the flank profile 2 extends over a first length L1 measured in the primary direction P, wherein a ratio between the first length L1 to the first thickness D1 has a value between 0.5 and 1.9, preferably between 0.6 and 1.7 and more preferably between 0.7 and 1.5.

It is particularly preferred that the metal layer 12 has a third thickness D3 in the local minimum 22, a ratio of the third thickness D3 to the second thickness D2 having a value between 0.1 and 1, preferably between 0.2 and 0.8 and more preferably between 0.3 and 0.6. FIG. 1 also shows an imaginary straight first connecting line V1 and an imaginary straight second connecting line V2. The first connection line V1 passes through the first edge 15 and the second edge 16 and is inclined relative to the bonding area 25 by a first angle W1, while the second connection line V2 passes through the second edge 16 and the local maximum 21. Thereby, the second connection line V2 is inclined with respect to the bonding area 25 by a second angle W2. Preferably, it is provided that the second angle W2 is larger than the first angle W1. For example, the ratio of the second angle W2 to the first angle W1 has a value between 1 and 2.5, preferably between 1-1.2 and 2 or more preferably of about 1.4 and 1.8. It is further provided that the flank profile 2 extends from the second edge 16 at the lower side 32 to the local maximum 21 over a second length L2, wherein a ratio between the second length L2 to the first length L1 has a value between 0.2 and 0.7, preferably between 0.25 and 0.6, and more preferably between 0.3 and 0.5. Preferably, a ratio between the second thickness D2 to the first length L1 has a value between 0.085 and 0.4, preferably between 0.09 and 0.35, and more preferably between 0.1 and 0.3 or even 0.11.

Furthermore, in the illustrated embodiment example of FIG. 1, the first thickness D1 is between 0.2 and 1 mm thick, preferably between 0.25 and 0.8 mm, and more preferably between 0.3 and 0.6 mm.

Figure 2:
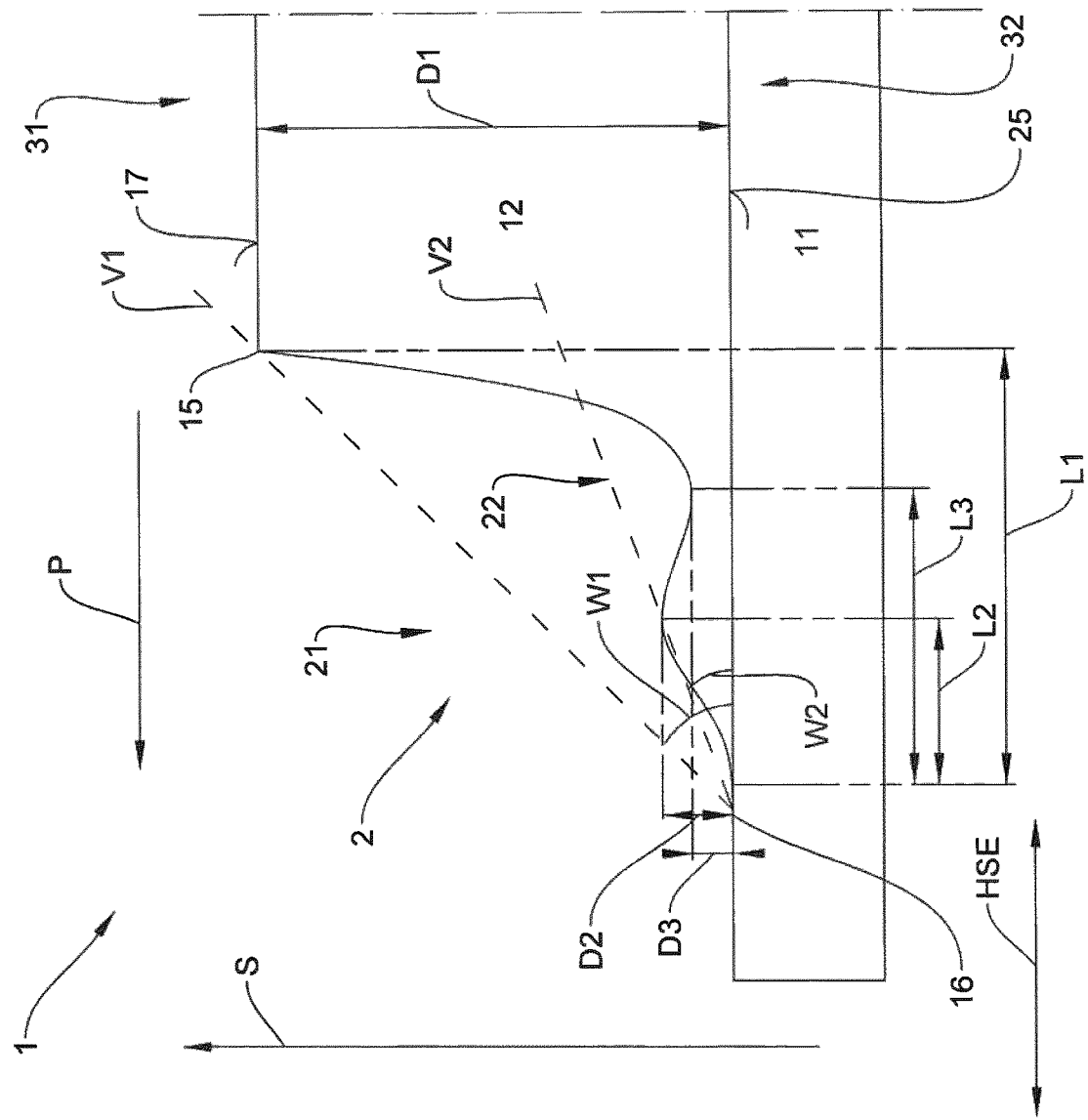

FIG. 2 schematically shows a carrier substrate 1 according to a second preferred embodiment of the present invention. Here the embodiment corresponds essentially to that of FIG. 1 and differs only in that the first thickness D1 has a value between 0.4 and 2.5 mm, preferably between 0.5 and 2 mm, and more preferably between 0.6 and 1.5 mm. In other words, compared to the embodiment of FIG. 1, there is a comparatively thick metal layer 12 in the central region. Preferably, a ratio of the second thickness D2 to the first thickness D1 here has a value between 0.01 and 0.5, preferably between 0.05 and 0.4, and more preferably between 0.01 and 0.3. Preferably, it is provided that a ratio of the second angle W2 to the first angle W1 is smaller than 0.8, preferably smaller than 0.7, and more preferably smaller than 0.6.

Figure 3:
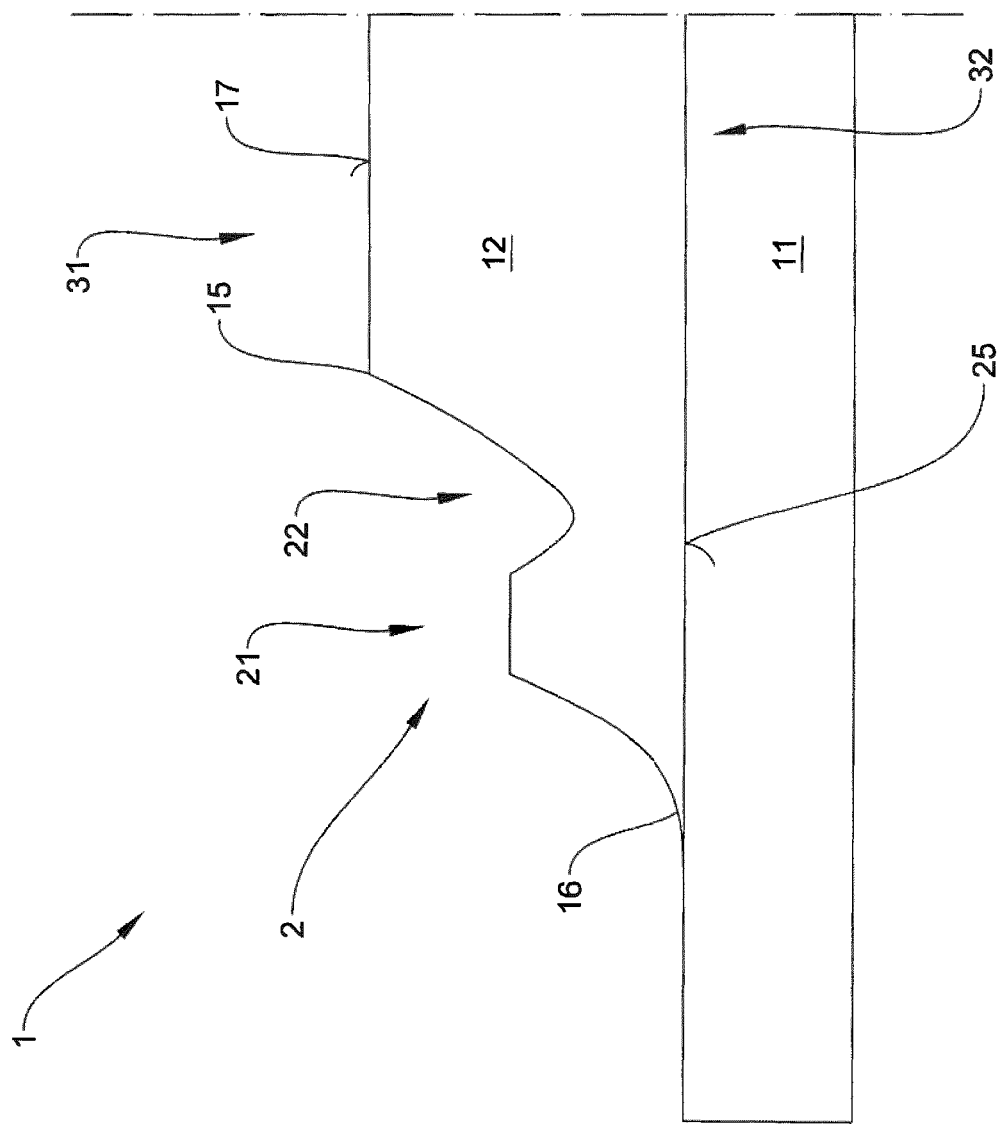

FIG. 3 schematically shows a carrier substrate according to a third preferred embodiment of the present invention. The embodiment corresponds essentially to that of FIG. 1 and differs from the embodiment shown there only in that a plateau-shaped local maximum 21 is formed here instead of a dome-shaped local maximum 21.

Figure 4:
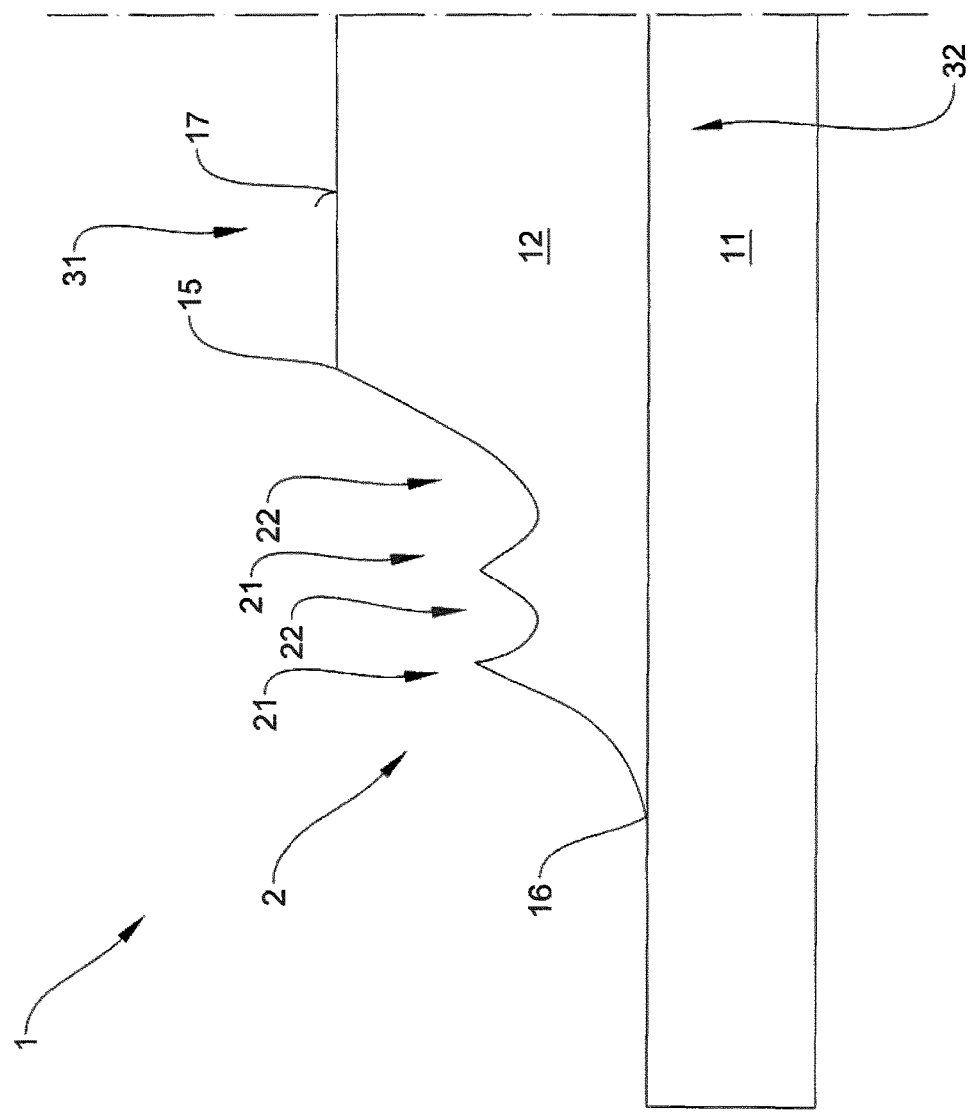

FIG. 4 schematically shows a carrier substrate 1 according to a fourth preferred embodiment of the present invention, wherein the flank profile 2 has several local maxima 21 and several local minima 22. In this case, the metal layer 12 has the same thickness in the respective local maxima 21 and local minima 22. However, it is also conceivable that the metal layer 12 has different thicknesses in the different local maxima 21 and/or local minima 22.

Figure 5:
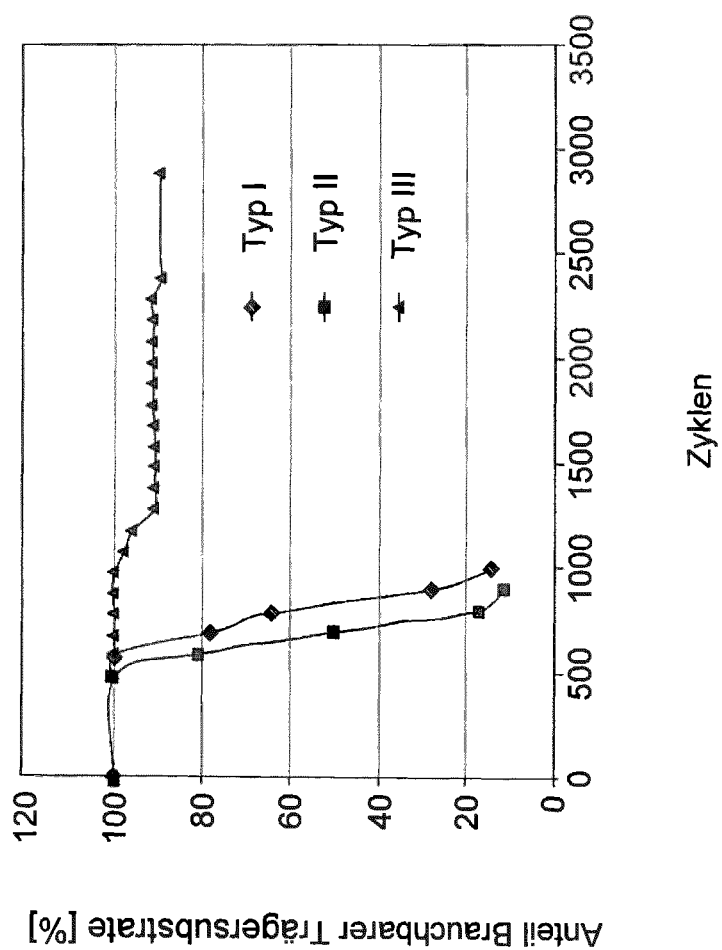
FIG. 5 Graphical representation of measurement results for thermal shock resistance and FIG. 6 Master card having a predetermined breaking point, sectional view.

FIG. 5 shows graphically the results of measurements of thermal shock resistance. In particular, the respective number of temperature cycles is plotted here against the percentage of still usable carrier substrates 1. The following tests on thermal shock resistance were carried out on carrier substrates 1 comprising an insulating layer 11, a metal layer 12 and a further metal layer 12 (the insulating layer 11 being arranged between the metal layer 12 and the further metal layer 12), which comprise an insulation layer 11 made from HPS9 having an insulation layer thickness ID of 0.32 mm or 0.25 mm, and a metal layer 12 and a further metal layer 12 each having a 0.3 mm copper layer.

The tests on thermal shock resistance were carried out between −55° and +150°. Within one cycle, the respective carrier substrate 1 is exposed to a temperature fluctuation between −55° and +150° and the number of cycles, after which delamination or tearing of the insulating layer 11 or the metal layer 12 is detected, is thus recorded (for example by means of an ultrasonic imaging process or by visual inspection). The average number of cycles, after which the carrier substrates 1 were still usable or showed no delamination, is thus a measure of the thermal shock resistance of the carrier substrate 1. The tests on thermal shock resistance were carried out for

- a type I carrier substrate having an insulation layer thickness of 0.25 mm, a material weakening in the form of a dome-shaped recess in the edge region, a curved flank profile and no flank profile with a local maximum 21 and a local minimum 22,
- a type II carrier substrate having an insulation layer thickness of 0.32 mm, a material weakening in the form of a dome-shaped recess in the edge region, a curved flank 2 and no flank profile 2 with a local maximum 21 and a local minimum 22, and
- a type III carrier substrate having an insulation layer thickness of 0.32 mm, a material weakening in the form of a dome-shaped recess in the edge region and a flank profile 2 with a local maximum 21 and a local minimum 22.

For the Type I carrier substrate, the percentage of usable carrier substrates was found to decrease after approximately 800 thermal cycles.

For the Type II carrier substrate, the percentage of usable carrier substrates was found to decrease after about 700 thermal cycles.

For the Type III carrier substrate, it was found that only after more than 1000 cycles did the percentage of usable carrier substrates decrease, and at more than 2000 cycles it was still well above 80%.

Accordingly, the following results can be taken from the tests:

The flank profile 2 having the local maximum 21 and the local minimum 22 causes a significant improvement of the thermal shock resistance compared to the previous approaches, in which dome-shaped recesses are incorporated into the edge area.

Figure 6:
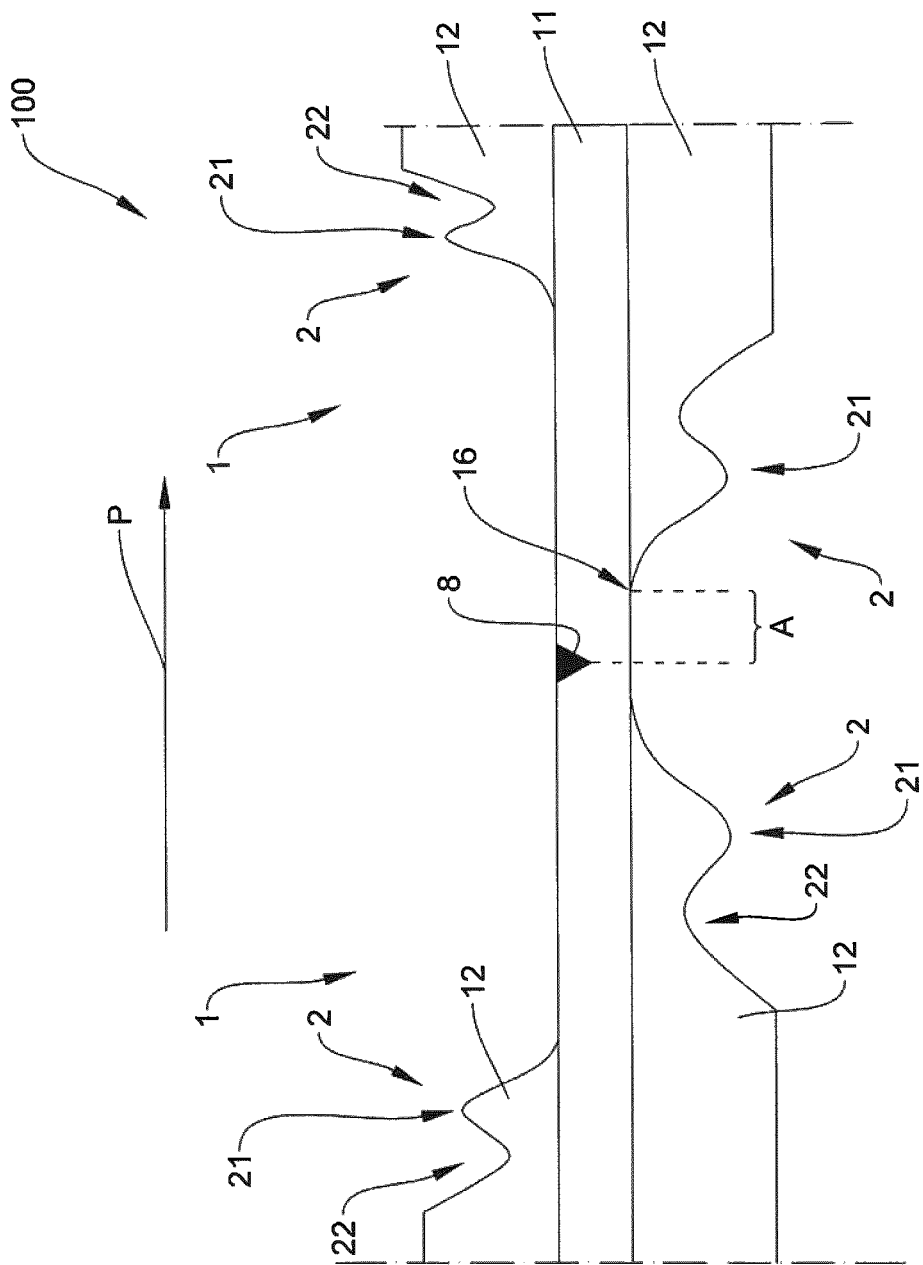

FIG. 6 shows a master card 100 having a predetermined breaking point 8. Preferably, such a master card 100 comprises several carrier substrates 1 which are separated from each other along the predetermined breaking point 8 for individualizing. It turned out to be advantageous for a fraction behaviour of the master card 100 if the predetermined breaking point 8 extends at least in regions adjacent to the flank profile 2 having the local maximum 21 and the local minimum 22. In particular, it is provided that, starting from the predetermined breaking line 8 viewed in the primary direction P, the metal layer 12 or the further metal layer 12 each start with a flank profile 2. In particular, it turned to be advantageous if a distance A between the second edge 16 and the predetermined breaking line 8, in particular a centre of the predetermined breaking line 8, is less than 1 mm. In particular, a ratio of the distance A to the first length L1 has a value between 0.0 and 1.5. It is particularly preferred that the predetermined breaking point 8 is realized on the side of the metal layer 12 and the distance A of the flank profile 2 to the further metal layer 12 (on the opposite side of the insulation layer 11) is smaller than the distance A between the metal layer 12 and the predetermined breaking point 8. In particular, it is conceivable that the further metal layer 12 extends as far as possible in the direction of the predetermined breaking point 8 in order to stabilize the insulation layer 11 as backside metallization, in particular if the insulation layer 11 is configured to be comparatively thin, i.e., thinner than 1 mm, preferably thinner than 0.8 mm. In the shown embodiment, all metal layers 12 comprise a flank profile 2 having a first maximum 21 and a minimum 22. It is also conceivable that instead of a flank profile 2 having a local maximum 21 or local minimum 22, the metal layer 12 or the further metal layer 12 have a slanted or curved flank profile 2 or an edge region having a material weakening, as disclosed in EP 1 061 783 A2, the contents of which are explicitly referred to in this aspect. At least one of the metal layers 12 on the insulation layer 11 comprises a flank profile 2 having a local maximum 12 and a local minimum 22.

Preferably, the insulation layer 11 has a thickness of less than 0.25 mm and more preferably less than 0.2 mm. Having such thin insulation layers, backside metallization is required.

LIST OF REFERENCE SIGNS

1 Carrier substrate
2 Flank profile
8 Predetermined breaking point
11 Insulation layer
12 Metal layer
15 First edge
16 Second edge
17 Functional area
21 local maximum
22 local minimum
25 bonding area
31 upper side
32 lower side
100 master card
D1 first thickness
D2 second thickness
D3 third thickness
V1 first connection line
V2 second connection line
L1 first length
L2 second length
L3 third length
W1 first angle
W2 second angle
S Stacking direction
HSE Main extension plane
P Primary direction
A distance

The invention claimed is:
1. A carrier substrate (1) comprising
an insulation layer (11) and a metal layer (12), wherein the metal layer (12) and the insulation layer (11) are materially bonded to each other by a DCB bonding process,
wherein a flank profile (2) at least zonally borders the metal layer (12) in a primary direction (P) extending parallel to the main extension plane (HSE),
wherein, viewed in the primary direction (P), the flank profile (2) extends from a first edge (15) on an upper side (31) of the metal layer (12), which faces away from the insulation layer (11), to a second edge (16) on a lower side (32) of the metal layer (12), which faces the insulation layer (11), characterized in that the flank profile (2), viewed in the primary direction (P), has at least one local maximum (21) and at least one local minimum (22).

2. The carrier substrate (1) according to claim 1, wherein the metal layer (12) has a first thickness (D1) outside the flank profile (2) and a second thickness (D2) in the local maximum (21), wherein the second thickness (D2) is smaller than the first thickness (D1).

3. The carrier substrate (1) according to claim 2, wherein a ratio of the second thickness (D2) to the first thickness (D1) is less than 0.95.

4. The carrier substrate (1) according to claim 3, wherein a second thickness (D2) to the first length (L1) has a value between 0.08 and 0.4.

5. The carrier substrate (1) according to claim 2, wherein the flank profile (2) extends over a first length (L1) measured in the primary direction (P), wherein a ratio between the first length (L1) to the first thickness (D1) has a value between 0.5 and 1.9.

6. The carrier substrate (1) according to claim 2, wherein the flank profile (2) extends from the second edge (16) on the lower side (32) to the local maximum (21) over a second length (L2), wherein a ratio of the second length (L2) to the first length (L1) has a value between 0.2 and 0.7.

7. The carrier substrate (1) according to claim 2, wherein the metal layer (12) has a third thickness (D3) in the local minimum (22), wherein a ratio of the third thickness (D3) to the second thickness (D2) has a value between 0.1 and 1.

8. The carrier substrate (1) according claim 1, wherein an imaginary straight first connecting line (V1), which passes through the first edge (16) and the second edge (15), is inclined relative to a bonding area (25), via which the metal layer (12) is bonded to the insulation layer (11), is inclined by a first angle (W1), and wherein an imaginary straight second connecting line (V2), which passes through the second edge (16) and the local maximum (21), is inclined by a second angle (W2) relative to the bonding area (25).

9. The carrier substrate (1) according to claim 8, wherein the second angle (W2) is smaller than the first angle (W1).

10. The carrier substrate according to claim 8, wherein the second angle (W2) is larger than the first angle (W1).

11. The carrier substrate according to claim 9, wherein the ratio between the first angle (W1) and the second angle (W2) changes along a circumferential direction extending parallel to the main extension plane (HSE).

12. The carrier substrate (1) according to claim 1, wherein the first thickness (D1) has a value
between 0.2 and 1.0 mm or
between 0.4 and 2.5 mm.

13. The carrier substrate (1) according to claim 1, wherein the carrier substrate (1) is embedded in an encapsulation.

14. The carrier substrate (1) according to claim 13, wherein a second electrical component is provided on the outside of the encapsulation, wherein the first electrical component is connected to the first electrical component via a through-hole connection extending through the encapsulation.

15. The carrier substrate (1) according to claim 1, wherein
flank profile (2) is an etching plank profile;
the metal layer (12) has a first thickness (D1) outside the flank profile (2), and a second thickness (D2) in the local maximum (21), wherein the second thickness (D2) is smaller than the first thickness (D1);
a ratio of the second thickness (D2) to the first thickness (D1) is less than 0.95;
the flank profile (2) extends over a first length (L1) measured in the primary direction (P), wherein a ratio between the first length (L1) to the first thickness (D1) has a value between 0.5 and 1.9;
an imaginary straight first connecting line (V1), which passes through the first edge (16) and the second edge (15), is inclined relative to a bonding area (25), via which the metal layer (12) is bonded to the insulation layer (11), is inclined by a first angle (W1), and wherein an imaginary straight second connecting line (V2), which passes through the second edge (16) and the local maximum (21), is inclined by a second angle (W2) relative to the bonding area (25).

16. The carrier substrate (1) according to claim 1, wherein flank profile (2) is an etching plank profile;

the metal layer (12) has a first thickness (D1) outside the flank profile (2), and a second thickness (D2) in the local maximum (21), wherein the second thickness (D2) is smaller than the first thickness (D1);

a ratio of the second thickness (D2) to the first thickness (D1) is less than 0.95;

the flank profile (2) extends over a first length (L1) measured in the primary direction (P), wherein a ratio between the first length (L1) to the first thickness (D1) has a value between 0.5 and 1.9; and an imaginary straight first connecting line (V1), which passes through the first edge (16) and the second edge (15), is inclined relative to a bonding area (25), via which the metal layer (12) is bonded to the insulation layer (11), is inclined by a first angle (W1), and wherein an imaginary straight second connecting line (V2), which passes through the second edge (16) and the local maximum (21), is inclined by a second angle (W2) relative to the bonding area (25).

17. A method of manufacturing a carrier substrate (1) according to claim 1, wherein the flank profile (2) is produced by an etching step.

18. A carrier substrate (1) comprising an insulation layer (11) and a metal layer (12), wherein a flank profile (2) at least zonally borders the metal layer (12) in a primary direction (P) extending parallel to the main extension plane (HSE), wherein, viewed in the primary direction (P), the flank profile (2) extends from a first edge (15) on an upper side (31) of the metal layer (12), which faces away from the insulation layer (11), to a second edge (16) on a lower side (32) of the metal layer (12), which faces the insulation layer (11), wherein a first thickness (D1) of the metal layer is outside the flank profile (2) is greater than 1 mm, characterized in that the flank profile (2), viewed in the primary direction (P), has at least one local maximum (21) and at least one local minimum (22).

* * * * *